United States Patent [19]

Hammon et al.

[11] 4,243,059

[45] Jan. 6, 1981

[54] METHOD AND DEVICE FOR DETERMINING THE HOMOGENEITY OF MAGNETIC DISPERSIONS

[75] Inventors: Fritz Hammon; Manfred Ohlinger, both of Frankenthal; Job-Werner Hartmann, Ludwigshafen, all of Fed. Rep. of Germany

[73] Assignee: BASF Aktiengesellschaft, Ludwigshafen, Fed. Rep. of Germany

[21] Appl. No.: 908,446

[22] Filed: May 22, 1978

[30] Foreign Application Priority Data

Jun. 10, 1977 [DE] Fed. Rep. of Germany ....... 2726370

[51] Int. Cl.³ ............................................. G01R 33/12
[52] U.S. Cl. ...................................... 137/2; 137/115; 73/61 R; 118/689; 324/204
[58] Field of Search ........................... 137/102, 2, 115; 73/61 R, 432 PS; 118/712, 689, 690; 324/204, 71 CP

[56] References Cited

U.S. PATENT DOCUMENTS

| 2,948,847 | 8/1960 | Bravenec et al. ................ 324/204 X |
| 4,131,081 | 12/1978 | Terashima ............................ 118/689 |

FOREIGN PATENT DOCUMENTS 853213 10/1952 Fed. Rep. of Germany .
1190927 5/1970 United Kingdom .

*Primary Examiner*—William R. Cline
*Attorney, Agent, or Firm*—Keil & Witherspoon

[57] ABSTRACT

In order to determine the homogeneity of a magnetic dispersion, part of the dispersion is conducted through a measuring cell prior to its application to a base, the size, number and type of those regions of the magnetic dispersion which interfere with the homogeneity being determined with the aid of magnetic measurements. The measuring cell contains a magnetic head, a magnetic dispersion is made to flow in a stream of constant cross section past the air gap of the magnetic head, and a magnetic field at least partially penetrating the magnetic dispersion is produced. From the characteristics of the amplified output voltage of the magnetic head the various parameters of the inhomogeneities in the magnetic dispersion can then be ascertained.

15 Claims, 7 Drawing Figures

METHOD AND DEVICE FOR DETERMINING THE HOMOGENEITY OF MAGNETIC DISPERSIONS

BACKGROUND OF THE INVENTION

1. Field of the Invention

The present invention concerns a method and a device for determining the homogeneity of magnetic dispersions, especially the distribution of the magnetizable powder in the dispersion, and the presence of agglomerates.

In the production of magnetic tape for recording information signals, a magnetic dispersion is applied in known manner to a nonmagnetic base usually a plastics film.

Such a magnetic dispersion consists essentially of a binder dissolved in a solvent and of magnetic particles having a size of from 0.1 to 2.0 μm finely dispersed therein, this binder ensuring good adhesion of the magnetic particles to the film after the solvent has been evaporated by drying the coated web.

Inhomogeneities, i.e. fluctuations in the density of the magnetizable powder in the dispersion, and agglomerates contained in the dispersion, not only produce fluctuations in density in the finished dry magnetic coating, but also an uneven surface, due to the fact that regions of varying density shrink to different degrees during drying. Density variations in the magnetic layer lead directly, and surface roughness, which causes the distance between the magnetic tape and head during recording to vary, leads indirectly, to fluctuations in the remanent flux in the recording medium. An uneven surface, moreover, generally causes recording and scanning losses.

Very high demands are placed upon the uniformity of the remanent magnetic flux in a tape, these demands depending on the intended application of the tape. The recording of audio signals, for example, is particularly critical in this respect, because the human ear can perceive amplitude fluctuations of approx. 3%. In the recording of digital information, larger fluctuations are admissible, but dropouts are undesirable. In video recording where signals of very short wavelength are stored, scanning losses should be kept to a minimum by keeping the roughness of the tape surface very low. The number of dropouts, caused essentially by variations in the distance between the head and tape, should be kept to a minimum.

2. Description of the Prior Art

A high degree of homogeneity in the magnetic dispersion is therefore decisive for the quality of magnetic tape produced therewith. Up to now, it has not been possible to test magnetic dispersions directly for their homogeneity.

A trial coating always had to be made, on the basis of which it was then decided to terminate or continue processing of the magnetic dispersion, e.g. by extending the grinding period, increasing the grinding intensity of carrying out further filtrations of the made-up magnetic dispersion. The economic production of a dispersion and optimum dispersion were therefore not possible.

OBJECT AND SUMMARY OF THE INVENTION

It is therefore an object of the invention to provide a method and a device for determining the homogeneity of the magnetic dispersion and the number and size of agglomerates contained therein by direct testing of the magnetic dispersion, i.e. without first having to make a trial coating.

This object is achieved according to the invention with a measuring process and device in which the magnetic dispersion flows past the air gap of a magnetic head in a stream of constant cross-section, a magnetic field, at least partly penetrating the magnetic dispersion, being produced outside the magnetic head or by the latter itself, and in which, after amplification of the voltage at the output of the magnetic head, its amplitude, its time-dependent characteristic, its duration and repetition frequency and, from these parameters, the size, number and type of those regions in the magnetic dispersion which interfere with the homogeneity are determined.

In order to detect agglomerates, the magnetic dispersion is exposed to a magnetic field prior to flowing past the air gap of the magnetic head, is then caused to become turbulent and, in this turbulent state, conducted past the air gap of the magnetic head without further exposure to magnetic fields.

The measuring device for carrying out the method of the invention is characterized by a measuring cell with a non-magnetizable channel through which the magnetic dispersion is fed, and by a magnetic head, past the air gap of which the channel is taken directly, by a circuit arrangement comprising an amplifier and one or more evaluation circuits and indicating means, and by a non-magnetizable pipe leading to and away from the measuring cell.

In a further embodiment of the measuring device of the invention, switchable magnetic means are provided in the measuring cell which induce a magnetic flux in the magnetic head.

In another embodiment of the invention, a switchable degaussing device for the magnetic dispersion is arranged directly upstream of the measuring cell.

In yet another embodiment of the invention, one or more flowdiverting devices, preferably a check valve and an outlet valve, which are actuatable by the evaluation circuits, are located in the pipe leading away from the measuring cell to permit removal of sections of the stream of magnetic dispersion which contain agglomerates and/or sections with inadequately dispersed magnetizable powder, the said devices enabling the pipe to be closed and, at the same time, to be opened laterally.

The measuring method according to the present invention makes possible the quick and direct determination of the uniformity of magnetic powder distribution in the course of the dispersing operation. The prerequisite for continuous measurement is thus created, as a result of which the dispersing operation can be optimized. By comparison with the conventional method, this process is simple and makes possible the economic manufacture of magnetic tapes of improved quality. The means for carrying out the measuring process are distinguished by their simplicity and the fact they can be used to carry out a wide variety of measurements.

BRIEF DESCRIPTION OF THE DRAWINGS

For a better understanding of the invention, an embodiment thereof will now be described in further detail with reference to the accompanying drawings, in which.

DESCRIPTION OF THE PREFERRED EMBODIMENTS

Figure 1A:
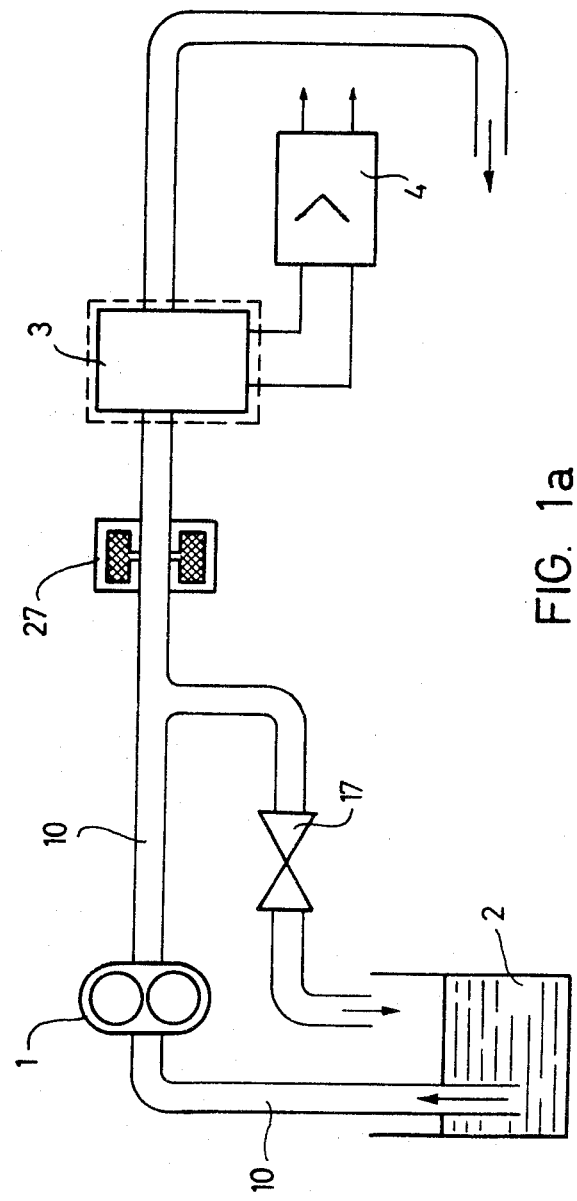
FIG. 1a–e show in diagrammatic representation the measuring device of the invention.
Figure 1B:
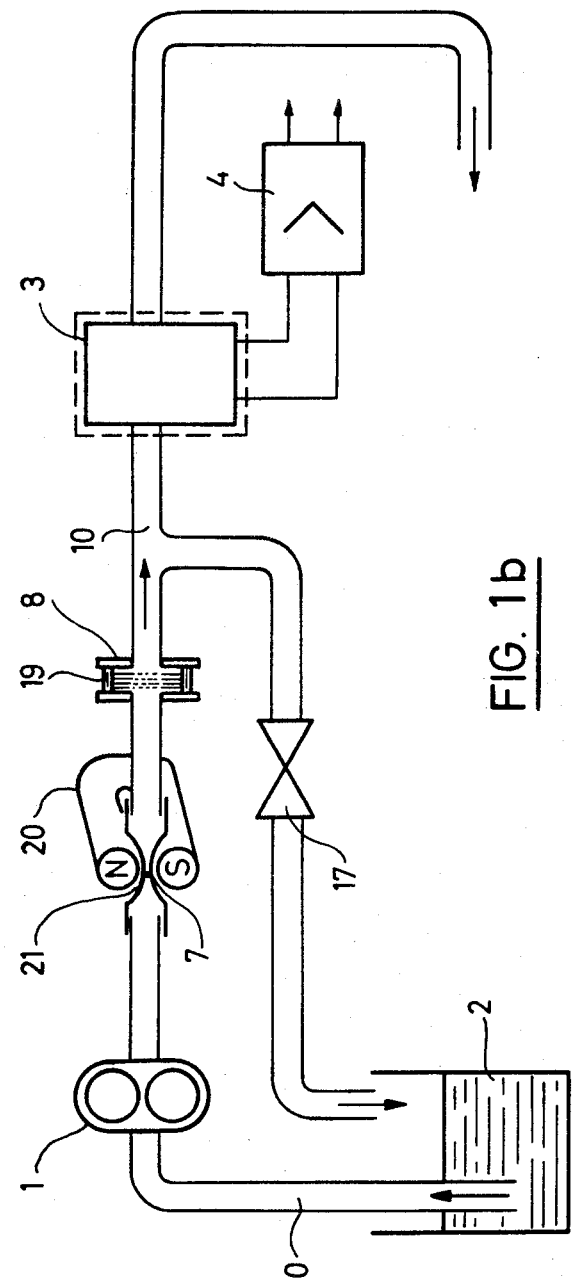
Figure 1C:
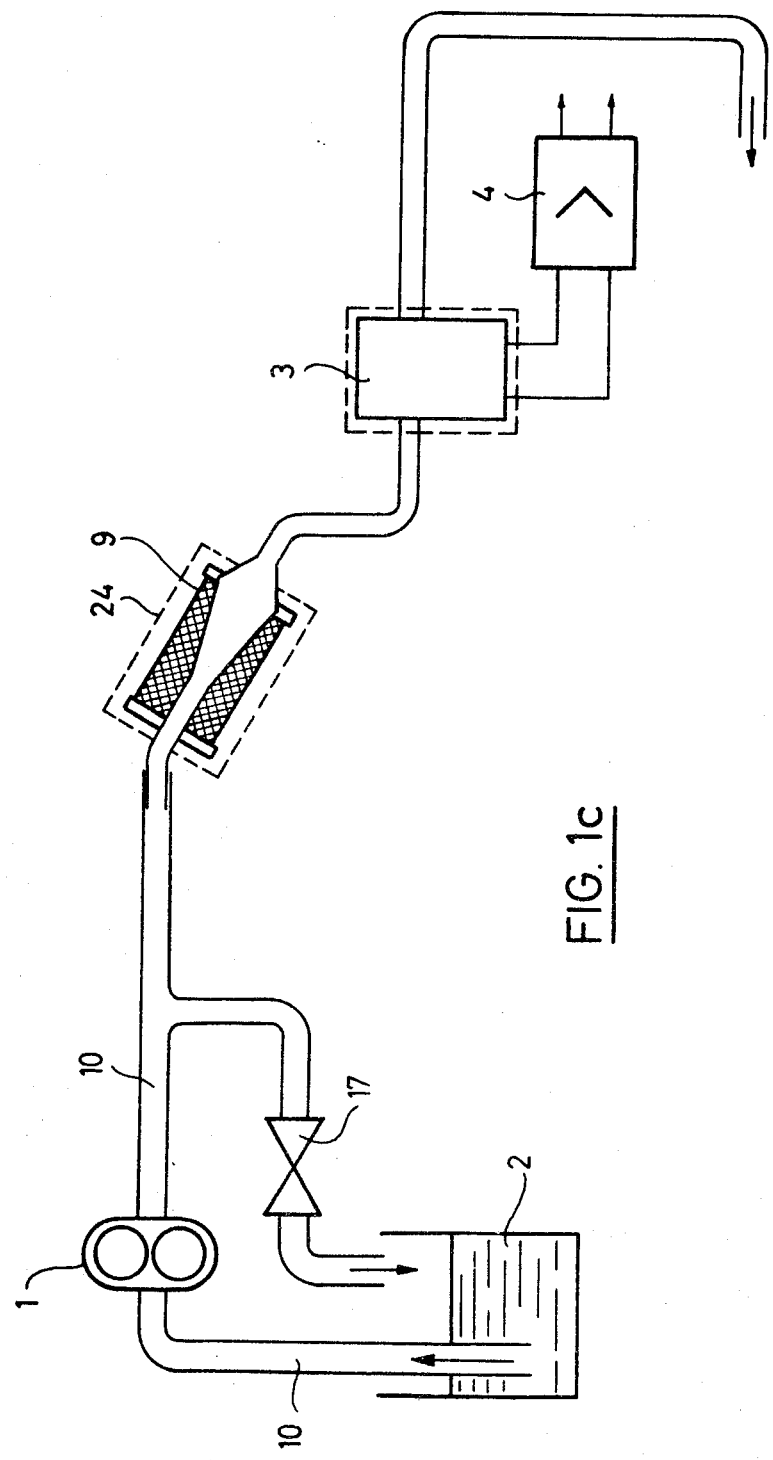
Figure 1D:
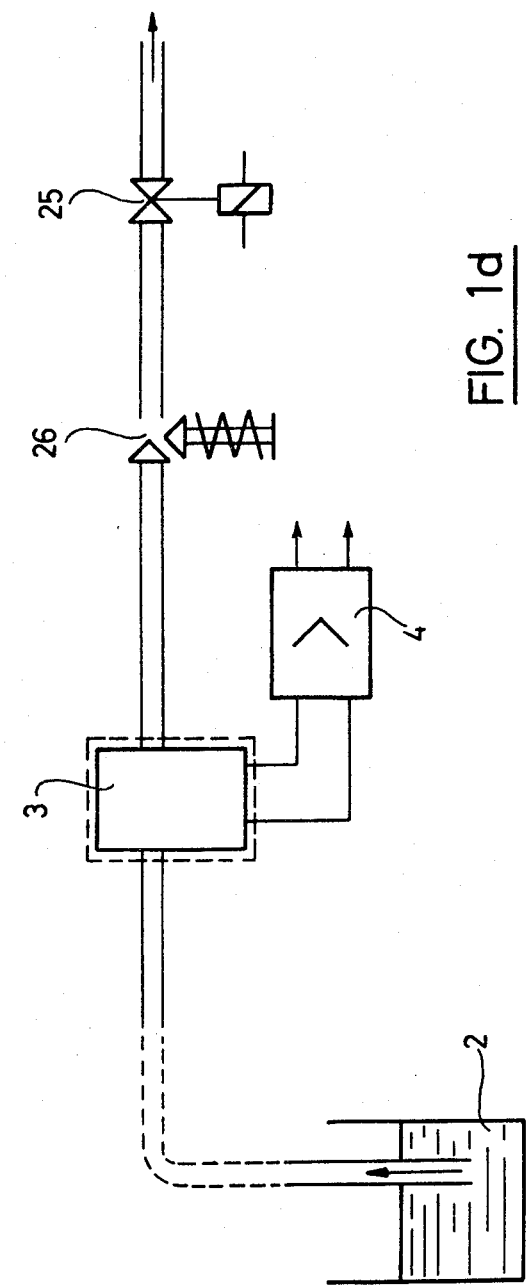
Figure 1E:
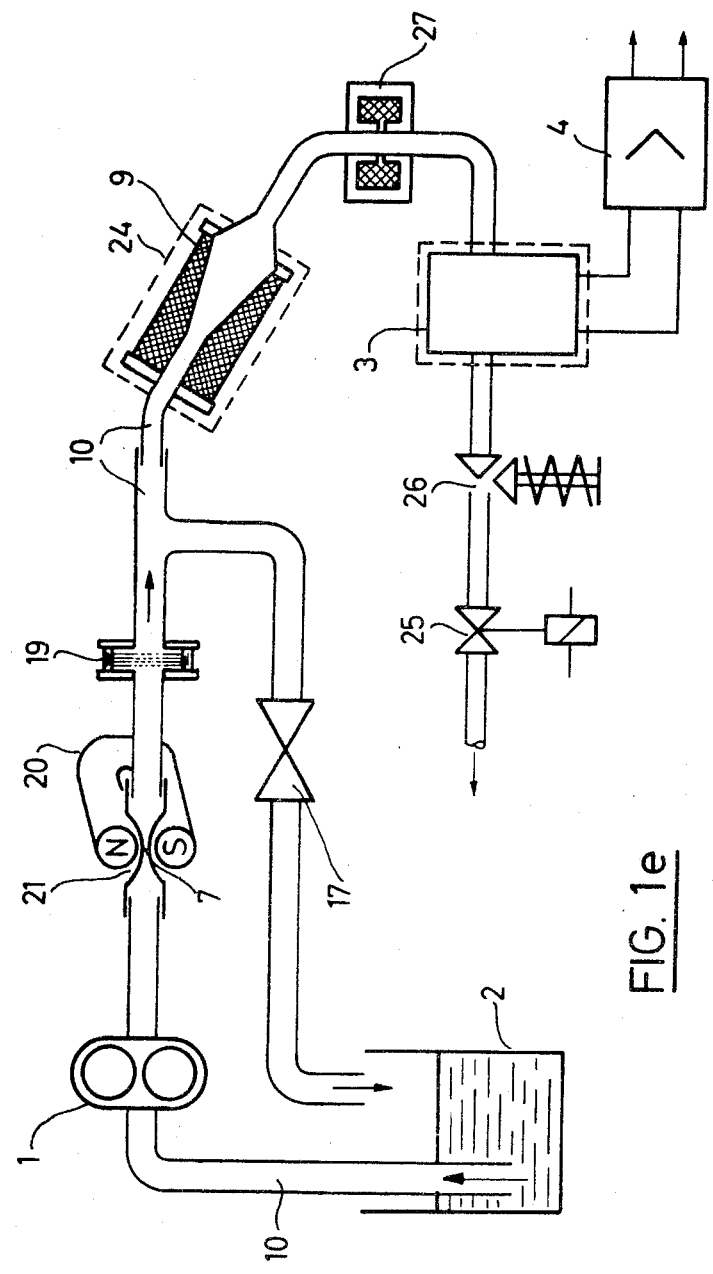

The measuring device of the invention comprises a number of measuring stations which, for clarity's sake, have been illustrated separately in FIGS. 1a–c. In practice it is advantageous to combine the individual measuring stations in a single measuring device (FIG. 1e). It is however also possible, for certain applications, to operate the individual measuring stations separately.

The heart of the measuring process and device is a measuring cell 3 which includes a magnetic head 11 (FIG. 2) of conventional design with an air gap 12 whose width is dependent on the desired resolution of the size of the inhomogeneities and agglomerates to be determined, the magnetic head being incorporated in a non-magnetizable channel 13 in such a way that the magnetic dispersion to be examined flows past the air gap 12. The cross-section of channel 13 immediately upstream of the air gap 12 is preferably of rectangular shape, the height 14 of the rectangle being between 10 and 1000μ. and its width approximately corresponding to between 1 and 1.5 times the length of the air gap 12 taken perpendicularly to the plane of the drawing, FIG. 2. Opposite one pole of the magnetic head 11 a magnet 15 is arranged so as to enclose channel 13 in such a way that part of its magnetic field induces a magnetic flux in the magnetic circuit of the magnetic head. The field strength in the air gap 12 of the magnetic head 11 should if possible exceed the coercive force of the magnetizable powder. Magnet 15 may be in the form of an energizable electromagnet or a removable permanent magnet. The measuring cell 3 designed in this way is surrounded completely by a screen 16 of highly permeable material, in order to keep out stray magnetic fields.

The measuring cell 3 is arranged downstream of a pump 1 in the path of the magnetic dispersion to be examined, as a bypass to a controllable valve 17. The flow velocity in the measuring cell 3 can be adjusted by means of valve 17. Since the measuring cell is sensitive to solid-borne vibration—like a microphone—flexible, solvent-resistant pressure hoses are used as connecting pipes. Pump 1 is advantageously a gear pump because the pulses produced by it are only small and of such high frequency that they are satisfactorily damped by the flexible hoses. As a result, there are no periodic pressure variations upstream of the air gap 12 of the magnetic head 11. In view of the abrasive action of the magnetizable powder, the gear wheels of the pump 1 are made of wear-resistant material. In order to prevent the pump 1 from drawing in air from outside, solvent is applied to its shaft seals.

Owing to the pressure generated by the pump 1, magnetic dispersion flows past the air gap 12 of the magnetic head 11. Density variations result in fluctuations in the permeability of the magnetic dispersion in front of the air gap 12. These fluctuations cause flux variations in the magnetic circuit of the magnetic head 11 and induce in its winding 18 a voltage whose magnitude is proportional to the density variation and inversely proportional to the length λ of the inhomogeneity. If the magnetic head 11 is followed by an integrating amplifier 4 whose gain is inversely proportional to frequency, then the signal voltage obtained at the output of the amplifier is proportional only to the density variation. The time-dependent characteristic of the signal voltage at the output of amplifier 4, therefore, corresponds to the amount of the momentary deviation from the mean density of the magnetic dispersion and appears as a noise voltage, due to the usually very fast density fluctuations. Particularly strong and exclusively negative pulses of the noise voltage are obtained if vapor or air bubbles are contained in the magnetic dispersion. The duration T of a pulse generated by a density variation is determined by the equation $T=\lambda/\nu$, wherein $\nu$ is the flow velocity of the magnetic dispersion and λ the length of the inhomogeneous region.

The flow velocity $\nu$ upstream of the air gap 12 can be determined using the equation $\nu = M/txq$ by measuring the time t which elapses between the pulse-like magnetization of the magnetic dispersion at any place preceding the measuring cell 3 and the voltage pulse induced in the magnetic head by this magnetization, provided that the cross-section q of the flow upstream of the air gap 12 and the volume M of the magnetic dispersion in the pipe between the chosen place and the air gap 12 are known. The pulse-like magnetization is preferably effected by means of a special marking head 27, near or within the measuring cell 3. The marking head 27 consists, for example, of an electromagnet through which the magnetic dispersion flows and whose hollow magnetic core is interrupted by a non-magnetic gap of a width from 0.5 to 3 mm. The connection of the magnetic head 27 to the pipe and the bore in the core thereof are designed in such a way that deformation of the magnetic pulse due to turbulence of the stream is kept to a minimum. Using the measured pulse duration T and the computed flow velocity $\nu$, it is also possible to ascertain the length of the inhomogeneity $\lambda = T x \nu$.

The magnetic field in front of the air gap 12 which is passed through the magnetic dispersion to measure the density variations may also be produced by the magnetic head 11 itself if a direct current flows through the winding 18 which will then fluctuate in accordance with the magnetic flux variations produced in the air gap 12 by the inhomogeneities in the magnetic dispersion. These variations in the current strength are decoupled capacitively or inductively from the d.c. circuit of the winding 18 and amplified and, as will be explained later on, utilized to determine the fluctuations in homogeneity. In this mode of operation, the magnet 15 may be omitted. The noise voltage determined in this way will be referred to hereinafter as d.c. noise. If the above-described measuring system is enlarged as shown in FIG. 1b, it is also possible to detect agglomerates in the magnetic dispersion. For this purpose, the magnet 15 in the measuring cell 3 is removed or switched off, a narrow-mesh multi-screen sieve 19 or a filter of conventional design is inserted in the pipe 10, preferably preceding the bypass, and a magnet 20 is arranged upstream of this filter, the magnetic dispersion being magnetized by the d.c. field of the said magnet. The magnet 20 may, for example, by a horseshoe magnet between the poles of which the pipe 10 is of reactangular cross-section 21, the field strength of the magnet being at least equal to the coercive force of the magnetizable powder.

Without the sieve 19, a noise similar to the d.c. noise would be obtained at the output of amplifier 4. However, as a result of the magnetic dispersion flowing through the sieve 19, it is caused to become so turbulent that the magnetization vectors of the individual magnetic particles, finely distributed by dispersion, are completely disoriented and have no effect on the magnetic head 11 because the magnetic fields of the individual particles cancel each other out. Any agglomerates which have not been broken down in the dispersing apparatus pass through the sieve whole, possibly while undergoing temporary deformation, and each agglomerate induces a voltage pulse in the magnetic head 11, because it acts as an individual magnet. However, since the magnetization vectors of these agglomerates will occupy a random position relative to the air gap 12 of the magnetic head 11, conclusions as to their density and length cannot be drawn directly, but only statistically from the derived electrical signal. A pulse train which appears after magnetization and creation of turbulence in the magnetic dispersion will be referred to as agglomerate noise.

The aperture size of the sieve 19 and the number of sieve screens employed should be such that, for a certain flow velocity, sufficient turbulence in the magnetic dispersion is guaranteed. Turbulence is considered adequate if the magnetic dispersion, after having been recycled by the pump after one magnetization, shows no decrease in agglomerate noise. This is usually achieved if the pressure drop in the sieve is larger than one bar. Such a pressure drop can be measured, for example, at a feed rate of 1.5 liters/min, a viscosity of the magnetic dispersion of 3 poise, and a cross-sectional flow area in the sieve of 25 mm$^2$, with an aperture size of 0.1 mm, a mesh number of 25 mm$^2$ and two sieve screens. Advantageously, the sieve is so designed that it can be easily replaced. Another way to create turbulence in the magnetic dispersion is to employ a rotating propeller in the pipe 10.

Using the controllable valve 17, the flow velocity of the magnetic dispersion is so set that the length of the voltage pulses induced by the smallest inhomogeneities and agglomerates to be detected is about 4.1 ms. This has the advantage that these very short pulses still remain audible in a loudspeaker following the amplifier 4. In the case of such an acoustically indicated inhomogeneity having a length of 50 $\mu$m, for example, a flow velocity of 50 cm/s is required.

In another measuring circuit (see FIG. 1c) the pipe 10, immediately upstream of the measuring cell 3, passes through a degaussing device 9. If magnet 15 is removed or switched off, a completely demagnetized dispersion will flow past the air gap 12 of magnetic head 11. The magnetic head 11 will then only be affected by the statistical fluctuation of the sum of the magnetic fields of the smallest magnetic domains (Weiss' domains) which generate a low but still measureable noise voltage in the magnetic head. By means of this noise voltage of the magnetic dispersion, the bulkerased noise voltage or the zero-modulation noise voltage of a magnetic tape to be manufactured from a particular magnetic dispersion can be determined since there is proportionality between the noise voltage of the magnetic dispersion and the noise voltage of the finished magnetic tape. The proportionality factor for a measuring system is determined once by means of a coated tape.

The degaussing device 9, which, in the case of a system for carrying out measurements according to FIGS. 1a-c, should be disconnectable with respect to measurements according to FIGS. 1a and b, consists, for example, of an air-cored coil supplied with mains current, through the centre of which coil the pipe 10 is taken or which itself forms part of the pipe. In order to ensure that the mains frequency is not recorded by the magnetic field of this coil, the current loading of the coil is decreased in the direction of flow of the magnetic dispersion, while the cross-section of its core is increased in the said direction (see FIG. 1c). If the flow velocities are very low, i.e. if the magnetic dispersion resides in the coil a long time, magnetic particles may form chains and thus produce increased noise. It is therefore advisable to arrange another turbulence-creating device at the coil outlet. The maximum field strength of the degaussing magnet should be at least as high as the coercivity of the magnetizable powder.

In order to prevent the magnetic degaussing field from straying into the measuring cell 3, the degaussing device 9 is also surrounded by a screen 24 and the direction of the residual degaussing field which may still be effective outside the screen 24 should be perpendicular to the direction of flow of the magnetic dispersion in the magnetic head 11. An adequate signal-to-noise ratio for carrying out the measurement is obtained if the voltage in the magnetic head, generated by the stray degaussing field, is approx. 10 db below the noise voltage generated by the magnetic dispersion.

These signal voltages obtained by means of the measuring device at the output of amplifier 4 may be evaluated acoustically, as has already been mentioned. The skilled artisan is perfectly capable of drawing conclusions as to the distribution and size of the inhomogeneities from the perceived voltage pulses.

However, to obtain an objective assessment, it is preferable to feed the signal voltages obtained with the aid of the measuring device via evaluation circuits to indicating instruments.

Figure 3:
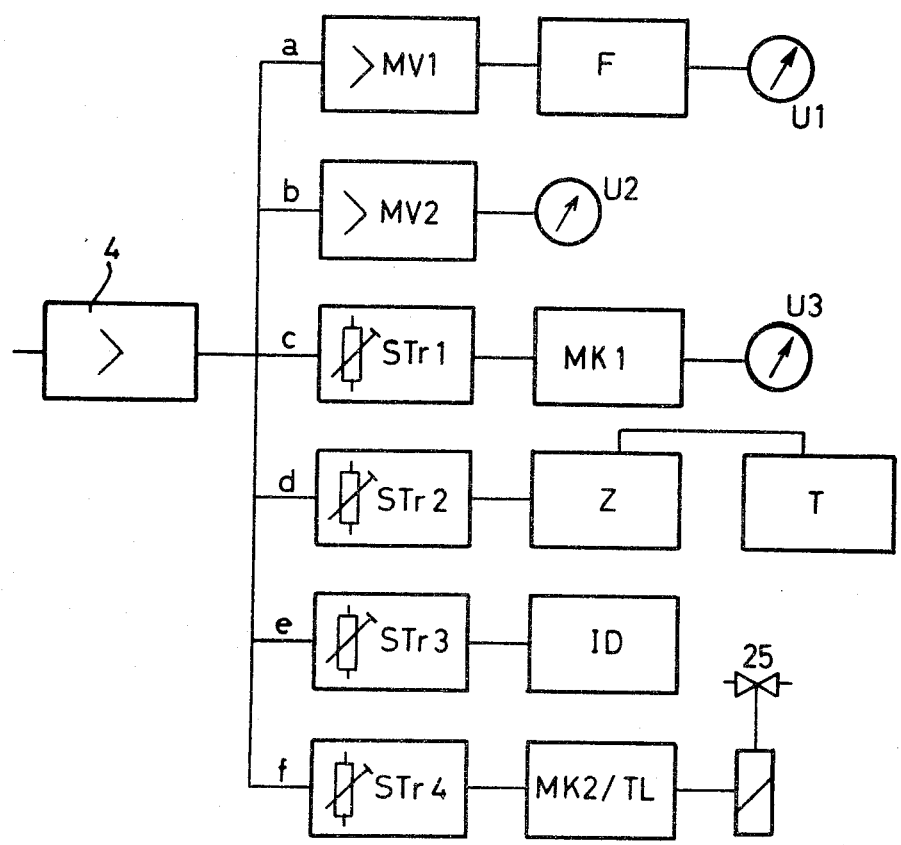
FIG. 3 shows an evaluation circuit of the measuring device.

Below, six examples of signal voltage evaluation are described with reference to FIG. 3.

In measuring branch a, a linear amplifier MV1 which can be adjusted for calibration purposes is connected to the amplifier 4, the output signals of amplifier MV1 being measured directly, or via electrical filters F (band-pass, high- or low-pass) by means of a voltmeter U1 indicating the arithmetic mean value. The filters F may for example be used to determine the agglomerate size spectrum. Owing to the fact that the arithmetic mean value is indicated, less notice is taken of the voltage pulses in the noise spectrum, so that with this measurement a value coresponding to the surface roughness of the tape surface is ascertained.

In measuring branch b, the arithmetic mean value indicator is replaced by a voltage peak indicator U2. The voltage pulses and hence the rough shape of the inhomogeneity are indicated by this instrument. The result obtained from branch b only gives an indication of the size of the density variations or of coarse agglomerates, but not necessarily an indication of the frequency of their occurrence.

The latter information can be obtained by means of a frequency meter, such as is shown in measuring branch c. By means of a Schmidt trigger STrl serving here as threshold switch, all major voltage pulses which exceed the threshold are fed to a monostable flip-flop MK 1 which converts all incoming voltage pulses into pulses of equal height and duration, so that the reading on a moving coil instrument U3 following the flip-flop is proportional to the pulse frequency.

In the case of magnetic dispersions which have been milled for a very long time and subjected to repeated fine filtration, and of very high threshold values, the pulse repetition frequency may drop to a value so low (<10 Hz) that the reading, due to inadequate damping of the instrument U3, is inaccurate and possibly too low. In such cases it is proposed to effect a periodically repeated voltage pulse count (measuring branch d) using a conventional pulse counter Z, the durations of the time intervals, which can be set by means of a clock pulse generator T, being advantageously chosen between 5 and 100 seconds.

As shown in the case of measuring branch e, the size of the agglomerate resulting in the voltage pulse can be ascertained if the Schmidt trigger STr3 is followed by a commercial measuring instrument ID for determining the duration of pulses according to the equation $\lambda = v \times T$.

Finally, it is possible, in a further development of the measuring method of the invention, in the case of magnetic dispersions containing only a few remaining critical agglomerates, to remove these agglomerates. This is done by the temporary diversion of a limited quantity of magnetic dispersion in which the agglomerate(s) to be eliminated is (are) contained, from the pipe 10 downstream of the measuring cell 3, diversion being initiated by the voltage pulse induced by the agglomerate and maintained for a limited period of time by electrical or mechanical delay means. FIGS. 1d and 3 illustrate the necessary extension of the above-described measuring circuits. Due to the voltage pulse induced by the agglomerate to be eliminated, and fed via amplifier 4 to the threshold switch STr4 (see measuring branch f), closure of a valve 25, preferably a magnetic valve, is triggered which is located in the pipe 10 downstream of the measuring cell 3. A commercial relief valve 26, arranged between valve 25 and measuring cell 3, opens owing to the excess pressure set up in the pipe 10 after valve 25 has been closed, so that the magnetic dispersion is branched off while the valve remains actuated. For actuating the magnetic valve 25 by means of the voltage pulses, the threshold switch STr4 is likewise followed by a monostable flip-flop MK2 with a switching duration of 0.5 to 3 seconds which controls a power transistor TL in whose circuit the magnetic valve 25 is included.

Instead of the combination of magnetic valve 25 and relief valve 26, it is of course also possible to use other means for diverting the flow of dispersion, or to use combinations thereof, for example two magnetic valves operating alternately, or a controllable three-way valve.

To continuously monitor magnetic dispersions to be manufactured in a commercial plant, the indicating instruments for the arithmetic mean value, the peak value and for pulse repetition frequency measurement are advantageously replaced by graphic recorders.

Figure 2:
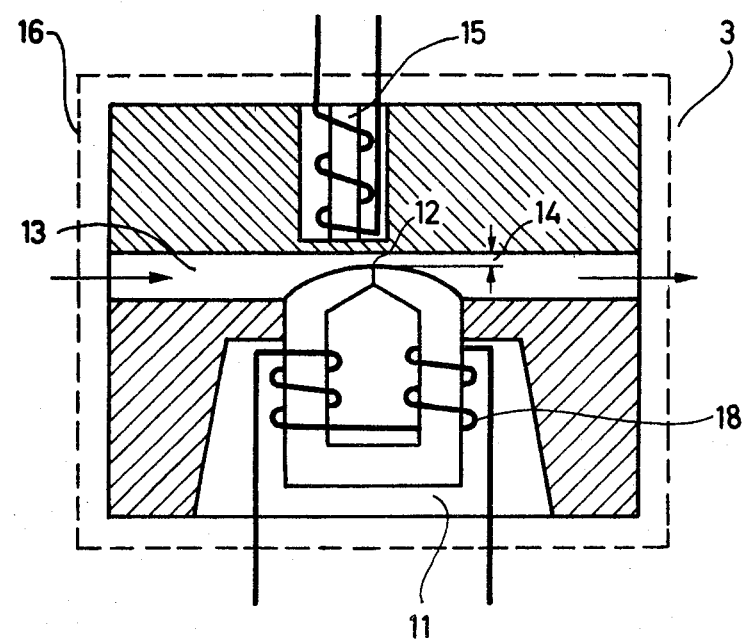
FIG. 2 is a cross-section of the measuring cell of the device of FIG. 1.

It is expedient to combine the individual measuring circuits according to FIGS. 1a-c in a single measuring setup as shown in FIG. 1e, and to subject a bleed stream of the magnetic dispersion, taken via the measuring device (FIG. 1e), in the course of a measuring sequence to the individual measurements by, for example, the controlled switching on and off of the degaussing device 9 and electromagnet 15 (cf. FIG. 2).

As is apparent from the above description, the invention is not confined to the embodiment illustrated here, but may be adapted to suit the given measuring requirements of a particular case, within the scope of the present invention, using the selection of components and equipment parts available to the skilled artisan by exchanging such components and parts of extending the measuring arrangement. It should be particularly emphasized that with a measuring device according to the invention it is possible to automatically monitor the magnetic dispersion during its manufacture and, where necessary, to remove unwanted particles.

Trials on a commercial scale have shown that the quality of the magnetic coating can be considerably improved by the new measuring method and device.

We claim:

1. A method of determining the homogeneity of a magnetic dispersion which comprises the steps of
   subjecting the dispersion, while in the form of a flowing stream, to a magnetic field,
   conducting the flowing magnetic dispersion past the air gap of a magnetic head,
   sensing the voltage generated by said head, and
   determining from the sensed voltage the degree of homogeneity of the dispersion.

2. A method as claimed in claim 1, in which the dispersion is conducted past said air gap in a stream of uniform cross section.

3. A method as claimed in claim 1 or 2, in which the determining step includes measuring at least one member of the voltage parameter group comprising amplitude, time-dependent characteristic, duration and repetition frequency, to ascertain the degree of homogeneity of the dispersion.

4. A method as claimed in claim 2, in which the air gap is caused to be traversed by a magnetic field produced outside the measuring head.

5. A method as claimed in claim 2 or 4, in which the air gap is caused to be traversed by a field produced by the measuring head itself.

6. A method as claimed in claim 2, in which the magnetic dispersion is subjected to a magnetic field prior to passing the air gap of the measuring head.

7. A method as claimed in claim 6, which also comprises the step of causing the magnetic dispersion to become turbulent after magnetization.

8. A method as claimed in claim 2, 4, 6 or 7 which also comprises the step of degaussing the magnetic dispersion before it passes the gap of the measuring head.

9. A method as claimed in claim 8, in which, in order to remove sections of a stream of magnetic dispersion which contain agglomerates or insufficiently dispersed magnetizable powder, the determining step also includes producing from the sensed voltage, upon amplification and evaluation, a control signal when an adjustable threshold value is exceeded and effecting by means of said control signal temporary diversion of the stream of magnetic dispersion from its normal path for a predetermined period of time.

10. A measuring device for determining the homogeneity of magnetic dispersions, comprising:
    a measuring cell which includes a magnetic head having an air gap and which provides a non-magnetizable channel defining a flow path for the magnetic dispersion past said air gap;
    amplifying means connected to the output of said head; and
    means connected to said amplifying means and including evaluation circuitry and indicating means, for measuring the amplified output voltage of said head.

11. A measuring device as claimed in claim 10, in which the measuring cell also includes magnet means for inducing in the air gap of the measuring head a magnetic flux.

12. A measuring device as claimed in claim 10, in which the flow connections of said dispersion which lead toward said measuring cell, include magnetic means and, between said magnetic means and said measuring cell, a device for causing said magnetic dispersion to become turbulent.

13. A measuring device as claimed in claim 10, in which, the flow connections of said dispersion which lead away from said cell include flow diverting means connected to and controlled by said evaluation circuitry.

14. A measuring device as claimed in claim 13, in which said flow-diverting means include an electrically controlled valve in combination with a relief valve, said relief valve automatically opening in response to the excess pressure generated by the closure of the electrically controlled valve.

15. A method of manufacturing a magnetic recording medium having a non-magnetic substrate to which a dispersion of magnetizable powder is applied, said method comprising:

ascertaining prior to application of the dispersion to the substrate the homogeneity of said dispersion by the steps of
subjecting the dispersion, while in the form of a flowing stream, to a magnetic field,
conducting the flowing magnetic dispersion past the air gap of a magnetic head,
sensing the voltage generated by said head, and
determining from the sensed voltage the degree of homogeneity of the dispersion, and permitting application of the dispersion to said substrate to occur only if the homogeneity is found to be above that of an allowable minimum homogeneity.

* * * * *